(12) United States Patent
Schmölz et al.

(10) Patent No.: US 6,751,140 B2
(45) Date of Patent: Jun. 15, 2004

(54) METHOD FOR TESTING INTEGRATED SEMICONDUCTOR MEMORY DEVICES

(75) Inventors: Paul Schmölz, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 10/245,626

(22) Filed: Sep. 17, 2002

(65) Prior Publication Data

US 2003/0053353 A1 Mar. 20, 2003

(30) Foreign Application Priority Data

Sep. 17, 2001 (DE) .......................................... 101 45 717

(51) Int. Cl.[7] .................................................. G11C 7/00
(52) U.S. Cl. .................. 365/201; 365/230.03; 365/200; 365/230.06
(58) Field of Search ................................. 365/201, 200, 365/230.03, 230.06

(56) References Cited

U.S. PATENT DOCUMENTS 5,588,115 A    12/1996   Augarten
6,269,455 B1    7/2001   Deas

*Primary Examiner*—Huan Hoang
(74) *Attorney, Agent, or Firm*—Laurence A. Greenberg; Werner H. Stemer; Gregory L. Mayback

(57) ABSTRACT

In order to be able to carry out the testing of integrated semiconductor memory devices particularly rapidly, it is proposed that the test result data of the respective memory area which are obtained in the area of the semiconductor memory device are formed, transmitted and/or stored externally in each case as a plurality of blockwise test result lists.

53 Claims, 5 Drawing Sheets

Fig_1

METHOD FOR TESTING INTEGRATED SEMICONDUCTOR MEMORY DEVICES

BACKGROUND OF THE INVENTION

Field of the Invention

The invention relates to a method for testing integrated semiconductor memory devices, in particular DRAM memories, or the like.

In order to obtain economic yields, in integrated semiconductor memory devices it is necessary to provide repair memory blocks with corresponding repair memory cells or replacement memory cells.

These memory cells of the repair memory blocks are intended to replace defective memory cells that occur. To that end, for each memory module, in particular for each DRAM module or the like, it is necessary to determine a corresponding replacement scheme, redundancy scheme or repair scheme. In order to determine such a replacement scheme, specific tests are carried out on the integrated semiconductor memory device, that is to say in particular on the DRAM memory or the like.

In prior-art methods for testing integrated semiconductor memory devices, in particular DRAM memories, or the like, at least one test is carried out on a memory area of the semiconductor memory device. Test result data for the memory area are generated for each test carried out and/or during each test carried out. For evaluation purposes and/or for further process steps, the test result data of the memory area are buffer-stored externally at least temporarily after a respective test carried out, outside the semiconductor memory device to be tested.

These known methods for testing integrated semiconductor memory devices are disadvantageous to the effect that as the memory size continually increases, that is to say with increasing integration density of the semiconductor memory devices, the bandwidth present for data exchange does not suffice, with regard to the outputting of the test result data, for keeping brief the respective transmission times for the transfer of the result data. Moreover, the respective bandwidth in the transmission channel cannot be increased in a straightforward manner.

SUMMARY OF THE INVENTION

It is accordingly an object of the invention to provide a method for testing integrated semiconductor memory devices that overcomes the hereinafore-mentioned disadvantages of the heretofore-known devices of this general type and that tests integrated semiconductor memory devices, in which the time taken for the transmission of the test result data is particularly short.

With the foregoing and other objects in view, there is provided, in accordance with the invention, a method for testing integrated semiconductor memory devices, in particular DRAM memories or the like, is characterized in that the test result data of the memory area of the semiconductor memory device are in each case formed, transmitted, and/or stored as a plurality of blockwise test result lists.

Consequently, it is a basic idea of the present invention not to carry out the organization and the transmission of the test result data in a single data block that corresponded precisely to the entire memory area, but rather to carry out the data organization and transmission in a blockwise manner in the form of so-called test result lists. This has the advantage that only the quantity of data representative of a respective block ever arises at a specific point in time and, consequently, the memory and management outlay arises in a temporally apportioned manner. As a result of the method, circuitry necessities such as area-intensive memory circuits or the like can be obviated or reduced. As a result of which, the previous channel bandwidths also remain adequate for data transmission.

Although this procedure is already advantageous when forming a test scheme with only a single test, the procedure according to the invention is appropriate precisely when carrying out a plurality of tests, in particular in a successive manner.

In this case, it is particularly advantageous if each of the tests to be carried out is carried out in a blockwise manner in each case in the memory area. This means that in each case only one area of the overall memory area that is provided and is to be tested is ever tested and that also, as a result, only test result data with regard to this respectively tested block ever arise and have to be managed and transmitted.

Although this is not mandatory, it is preferable for the same block structure to be used as a basis for the blockwise assignment of the test result data to the test result lists and/or the execution of the test.

In this case, it is furthermore preferable for in each case a block structure to be used as a basis that corresponds to that block structure of a blockwise configuration, interconnection, and/or organization of the memory area of the semiconductor memory device in a plurality of memory blocks, in particular in matrix form in each case.

The blockwise test result lists, which may be formed in particular in matrix form, may be formed, transmitted, and/or stored in each case after a specific number or after specific numbers of tests carried out. This is advantageously done after each individual test carried out. This makes it possible, in a particularly advantageous manner, to track the defect evolution of the entire memory area for the individual tests.

The test result lists are configured particularly clearly if they are formed as accumulated blockwise defect lists, in particular as accumulated blockwise defect matrixes or the like, in particular as so-called fail maps or the like.

In this case, the term accumulating or accumulation is to be understood to mean, in particular, the so-called "summation" of defects over a span of tests that are to be executed one after the other. In this case, the accumulated defect list or fail map specifies, after a test Tj which is intended to be the $j^{th}$ test in the series of all the tests, which memory cells of the respective block of the memory area have exhibited at least one defect in the previous j tests carried out. If appropriate, the term accumulation can also be understood to the effect that, for each cell of a respective block of the memory area, it is recorded whether and what defect it has exhibited for each of the j tests previously carried out, even though this detailed information will not generally be necessary.

It is particularly preferred that in each case a blockwise accumulated defect list is formed, transmitted and/or stored externally for each individual test carried out and after each test carried out, so that, in particular after carrying out all the tests on all the blocks, accumulating or accumulated defect lists for all the individual tests carried out are present for each of the tested blocks.

The test result list may be accumulated outside the area of the semiconductor memory device, that is to say externally, in particular in an external test device that is provided, if appropriate.

However, it is particularly preferred that the test result lists are accumulated within the area of the semiconductor memory device. In this case, it is then provided that, for each block individually in each case, firstly the respective blockwise accumulated defect list from a previous group of tests carried out or a previously carried out individual test for the respective block is externally transmitted and/or read into the semiconductor memory device, in particular from the external test device that is provided, if appropriate, the test result data or test result lists of the group of tests currently being carried out or of the test currently being carried out for the respective block are accumulated to form a current blockwise accumulated defect list for the respective block, and the respective current blockwise accumulated defect list for the respective block is then transmitted to a point outside the semiconductor memory device and/or stored, in particular in the area of the external test device that is provided, if appropriate.

In order to further shorten the times for transferring the test result lists or test result data, it is provided that the test result lists and, in particular, the accumulated defect lists, for example the defect matrixes or the like, are formed, transmitted, and/or stored in compressed fashion.

Preferably, the test results lists are compressed. In particular, the accumulated defect lists are compressed. In this case, most cell addresses of memory cells of a memory block that are defective during at least one test are taken up in a respective test result list. Furthermore, the cell addresses are preferably placed in the respective accumulated defect list as individual defects.

Furthermore, in the case of memory blocks configured in a matrix-like manner in columns and rows, column addresses and/or row addresses are used as cell addresses for specifying individual defects in the test result lists. These cell addresses can identify individual defects in the accumulated defect lists.

It has been shown that when specific numbers of defective memory cells occur in an area of a memory block of the memory area, individual defect correction is no longer expedient. In particular, the memory areas are often constructed and formed in a matrix-like manner. In these matrix-like memory areas with corresponding columns and rows, specific defects cause entire columns and/or entire rows of memory cells of a memory block of the memory area to fail or be defective, so that they would have to be replaced in their entirety.

Accordingly, it is particularly advantageous if, when a maximum number of defects is exceeded in a column or a row of a respective memory block of the memory area, this column or row, is taken up as a so-called must repair into the test result list and, in particular, into the accumulated defect list. This is done in particular by a must repair being specified by exclusive specification of the defective column or row, cell addresses of possible individual defects in the respective column or row that had already been noted beforehand and/or are to be noted later being removed from the test result list and, in particular, accumulated defect list or not being taken up therein.

In order to repair defective memory areas, provision is made of corresponding replacement memory blocks—often also blockwise. These blocks may, of course, likewise be defective. Therefore, it is preferred that possibly provided replacement/repair memory blocks are concomitantly taken into account and accordingly concomitantly tested during the division and/or assignment of the memory blocks and/or of the test result lists and accumulated defect lists.

In accordance with a preferred embodiment of the method, the tests may be formed, compiled, carried out, and/or evaluated essentially in the area of the semiconductor memory device, that is to say on-chip. It is particularly advantageous, however, if the tests are formed, compiled, carried out, and/or evaluated essentially in an area outside the semiconductor memory device, in particular in the area of an external test device that is provided, if appropriate. In this case, specially designed automatic testers, for example in the form of PC plug-in cards, may be provided and the respective memory chip affords more space for the actual memory area.

It is furthermore provided that on the basis of the test result lists and, in particular, of the accumulated defect lists, redundancy, repair and/or replacement schemes are generated, in particular for the replacement of defective individual cells, entire columns and/or rows by optionally provided repair/replacement memory blocks or parts thereof.

These redundancy, repair and/or replacement schemes are often carried out after the test cycle which takes place in a pre-fused stage of production. This is then often embodied in final form by a so-called fusing process, in which the replacement scheme and the associated circuit layout are permanently burned into the memory chip. In a post-fusing step, the memory module is then finally tested and then, because it can no longer be corrected or repaired, rejected in the event of just a single defect occurring.

It is economically expedient, therefore, in accordance with a particularly preferred embodiment of the method according to the invention, that the redundancy, repair, and/or replacement schemes are generated and/or executed incrementally, in particular after specific groups of tests carried out and/or after individual tests carried out.

In this case, it is furthermore advantageous that after each incremental redundancy, repair and/or replacement scheme that has been generated and/or carried out, previous tests or groups thereof are carried out anew in the memory area in a blockwise manner, in particular in order to assess the quality and the result of the correction carried out on the basis of the redundancy, repair and/or replacement scheme respectively employed.

This measure may be taken in addition to the measure that after each incremental redundancy, repair and/or replacement scheme that has been generated and/or carried out, the method continues with subsequent tests or groups thereof in the memory area.

In accordance with a further embodiment of the method according to the invention, it is provided that the redundancy, repair and/or replacement schemes are initially executed provisionally, in particular in a pre-fusing phase of the fabrication of the semiconductor memory device.

The formation and/or carrying out of incremental replacement schemes also enables the further data reduction in the case of the accumulated defect lists. Thus, it is conceivable, if the correct configuration of a replacement scheme that has been generated and/or carried out has been shown, to reset the respective defect list of a memory block of the memory area to zero, so that henceforth only newly arising defects are tracked in the accumulating defect list. However, this procedure is not mandatory but rather exclusively represents a further alternative of the procedure according to the invention.

In an advantageous manner, the formation, the compilation, the if appropriate also provisional carrying out and/or the testing of the redundancy, repair and/or replacement schemes is effected essentially in the area of the semiconductor memory device, that is to say on-chip.

As an alternative to this, the formation, the compilation, the if appropriate also provisional carrying out and/or the testing of the redundancy repair and/or replacement schemes may also be carried out in the area of an external test device that is provided.

The subject matter of the invention and its advantages over the prior art are elucidated further below through the following explanations.

In order to obtain economic yields, in DRAM modules it is necessary to provide repair cells which can replace defective memory cells. To that end, for each chip, it is necessary to determine a replacement scheme that is generally calculated by an external memory tester (ATE: Automatic Test Equipment). For the calculation, for each test step, the defect information must be read from the chip into the ATE.

On account of the known development that the memory size increases from year to year to a significantly greater extent than the bandwidth on the channel between chip and ATE, it turns out that the transmission time for the defect transfer is increasingly becoming a cost factor.

There are now proposals for compressing the defect information to a great extent in that, instead of the pass/fail information per cell, only the defect addresses and/or, in the event of a specific number of defects being exceeded per word or bit line, the corresponding line is identified as non-repairable.

Further-reaching proposals provide for the replacement scheme to be completely calculated on the chip. In this case, the problem quickly arises that—even with high compression—the information to be stored on the chip demands too much chip area. It is possible, then, to limit the test to relatively small blocks in which the replacement is calculated separately in each case. However, this leads to a considerable lengthening of the test time, since the test-inherent waiting times arise sequentially for all the blocks.

The present invention provides for two aims to be achieved simultaneously by blockwise transmission of, if appropriate, suitably compressed defect matrixes: (a) carrying out the tests using testers of low bandwidth at very high speed with no loss of defect information and (b) relocation of the area-intensive circuits (depending on concept buffer memory, redundancy processor) to an external tester.

Advantages of the invention described are the following:
reduction of the area requirement for BISR (Built-in-self-repair),
very high data compression for the transmission of the defect information,
possibility of using very inexpensive external testers (e.g. PC with plug-in card), and
possibility of using highly efficient algorithms of external testers.

One particular idea is the approach that the defect information to be accumulated can be transferred in a blockwise manner between the chip and external memory. In particular, the possibility of loading the defect information for a memory block from the external tester back into the chip again is also covered.

Inter alia, the following embodiments of the method according to the invention are produced:

a) Accumulation of the Defect Information and External Redundancy Calculation.

The buffer memory for the defect addresses of a block and a logic configuration for taking up new defects into the buffer memory are situated on the chip. Use is made of the requirement that at most a maximum of NRBL/NRWL defect addresses are to occur per word or bit line. If more defects are found, the respective line must be completely replaced; it then suffices to store the address of the corresponding word or bit line or row or column, respectively.

For each read operation, the procedure is as follows: for each block:

1) the defect information is transferred from the ATE to the chip,
2) the read operation is executed, the added defects being accumulated on-chip, and
3) the defect information on-chip, which now contains the defects in this block cumulated for all the tests that have taken place beforehand, is transferred back to the ATE.

After the conclusion of all the tests, the cumulated defect information is present for each block in the ATE. The redundancy processor of the ATE can then distribute the remaining individual cell defects between the remaining repair lines.

b) Connection to On-chip Test Pattern Generator and External Buffer Memory.

If the test pattern generation is effected on-chip, it would be advantageous for a buffer memory to be available externally per chip. The buffer memory can be independently written to and read from by the chip. The buffer memory could be applied e.g. directly on the needle card. Instead of the ATE, only a simple test sequence control would then be necessary which prescribes the order of the tests and reads out the end result. The ultimate redundancy calculation could then be implemented on-chip, together with the buffer memory or in the external ATE.

Other features that are considered as characteristic for the invention are set forth in the appended claims.

Although the invention is illustrated and described herein as embodied in a method for testing integrated semiconductor memory devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
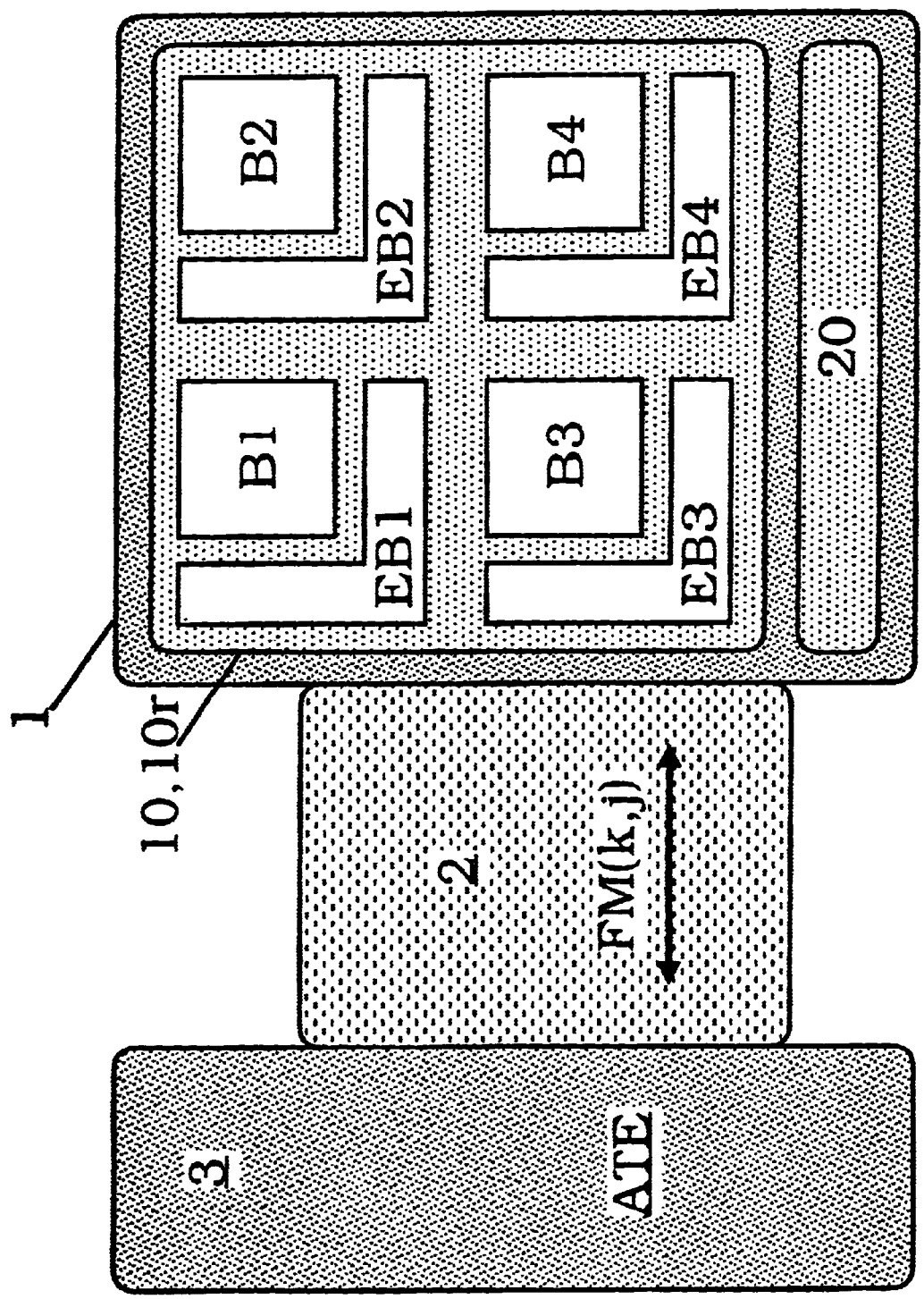
FIG. 1 is a diagrammatic plan view showing a configuration in which the method according to the invention can be employed.

Referring now to the figures of the drawings in detail and first, particularly to FIG. 1 thereof, there is shown a configuration with a semiconductor memory device 1 in which the method of the invention can be conducted.

The semiconductor memory device 1 to be tested is connected to an external test device 3, ATE via a communication channel 2. Via the connection channel 2, corresponding defect lists FM(k,j) are exchanged in a blockwise manner in the handshake method between the external test device 3, ATE and the semiconductor memory device 1 to be tested.

The semiconductor memory device 1 includes an actual memory area 10 with in this case four memory blocks B1, B2, B3 and B4. Furthermore, a replacement memory block EB1, EB2, EB3 and EB4 is respectively provided for each of the memory blocks B1, B2, B3 and B4, said replacement memory blocks together forming the replacement, repair or redundancy memory area 10r of the memory area 10 of the semiconductor memory device 1.

The replacement memory blocks EB1, EB2, EB3 and EB4 are used after the tests carried out in the memory area 10 and on the basis of the accumulated defect lists FM(k,j) then present and are correspondingly interconnected in order to replace defective partial areas of the memory blocks B1, B2, B3, and B4.

In the configuration shown in FIG. 1, the corresponding replacement scheme with the corresponding redundancy interconnection is generated by the redundancy processor 20 provided, which is provided on the memory chip of the semiconductor memory device 1.

The indexes k and j in the designation of the accumulated defect lists FM(k,j) denote, for k, the numbering of the blocks—thus, k then runs from 1 to 4—and respectively the numbering of the individual tests Tj to be carried out—thus, j then runs from 1 to N, if N individual tests T1, ..., Tj, ..., Tn are to be carried out.

Figure 2:
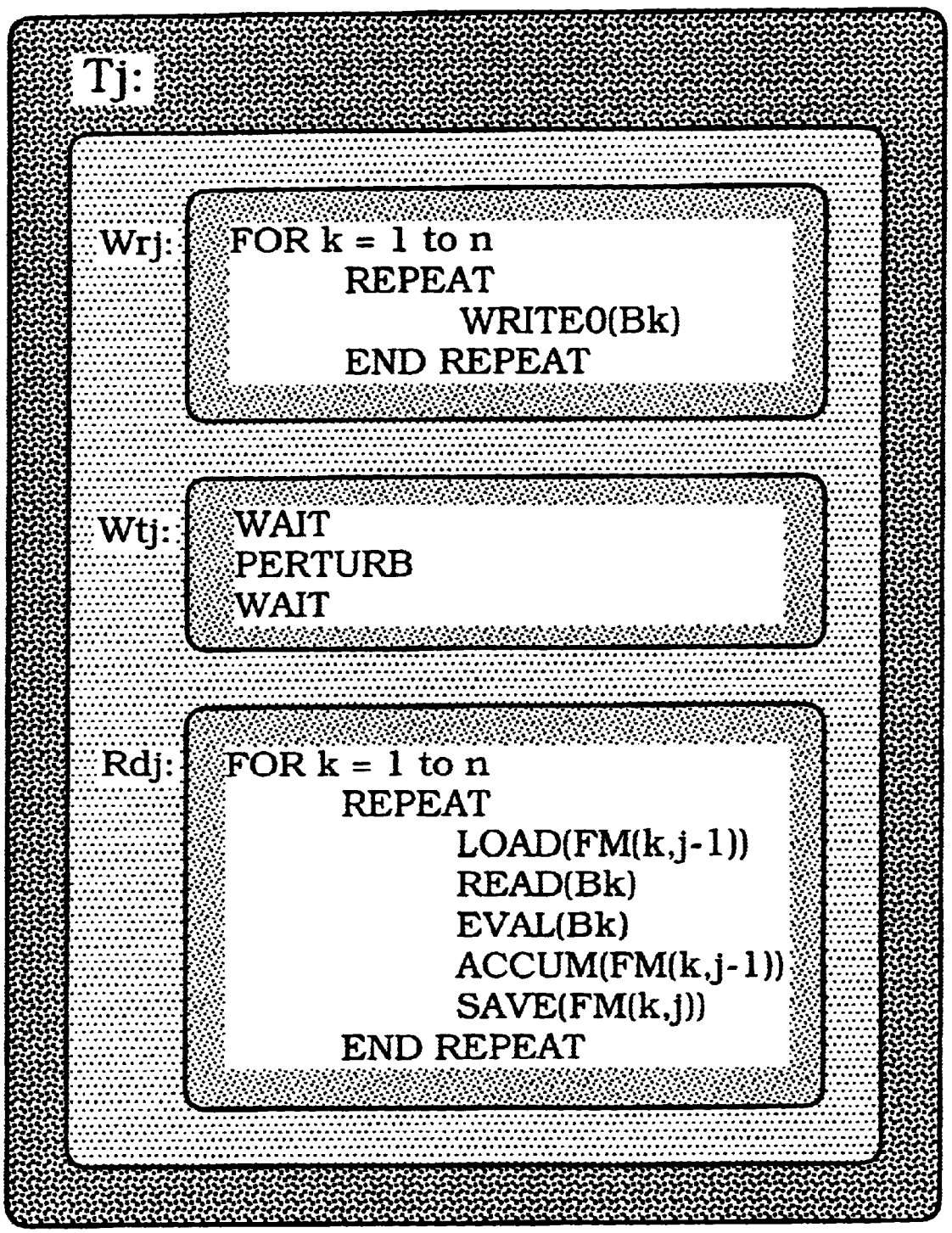
FIG. 2 is a block diagram showing an individual test of a method according to the invention.

FIG. 2 shows, in the form of a block diagram, an exemplary embodiment of an individual test Tj to be carried out. The individual test Tj is subdivided into three functional blocks, namely a write block Wrj, a waiting/influencing block Wtj, and a read block Rdj.

In the embodiment of a possible individual test Tj shown in FIG. 2, the memory area 10, 10r to be tested in the semiconductor memory device has n memory blocks B1, ..., Bk, Bn.

In the write block Wrj of the individual test Tj, a memory content, in this case a 0, is written in this case to all the blocks B1, ..., Bk, ..., Bn, in a write operation WRITE 0. Through this n-fold repetition of the write operation for the different memory blocks B1, ..., Bk, ..., Bn, the memory content 0 is written to all n memory blocks B1, ..., Bk, ..., Bn. As an alternative, a different memory content, for example a binary 1, can also be written in.

In the downstream waiting/influencing block Wtj, there is then a wait for a corresponding period of time (WAIT).

Afterward, specific disturbing influences (PERTURB) are executed on the memory blocks B1, ..., Bk, ..., Bn to be tested. These may consist for example in exposure to an elevated temperature. In the simplest case, for example, there is simply a wait for a specific period of time. This waiting may serve, for example, to ensure that the fabricated memory devices which can be put into service satisfy certain minimum requirements with regard to the retention of the memory information without a refresh cycle. Generally, in this case there is a wait during a specific multiple of the information retention time that is to be guaranteed.

The respective memory information is then read out by the so-called read block Rdj. This read block Rdj is likewise carried out for all n individual memory blocks B1, ..., Bk, ..., Bn. Within the repetition loop (REPEAT; END REPEAT), the following individual operations are carried out in this case: firstly, the corresponding defect list or fail map FM(k,j-1) previously present is loaded externally: LOAD(FM(k,j)). The current block Bk is then read out: READ (Bk). Afterward, the corresponding read result is evaluated in comparison with the write operation with regard to the current block Bk: EVAL(Bk). Afterward, the deviations found in the comparison operation EVAL are then accumulated in the present defect list or fail map FM(k,j-1): ACCUM(FM(k,j-1)). Afterward, the updated defect list or fail map FM(k,j-1) is then stored externally as updated accumulated defect list or fail map FM(k,j): SAVE(FM(k,j)).

Figure 3:
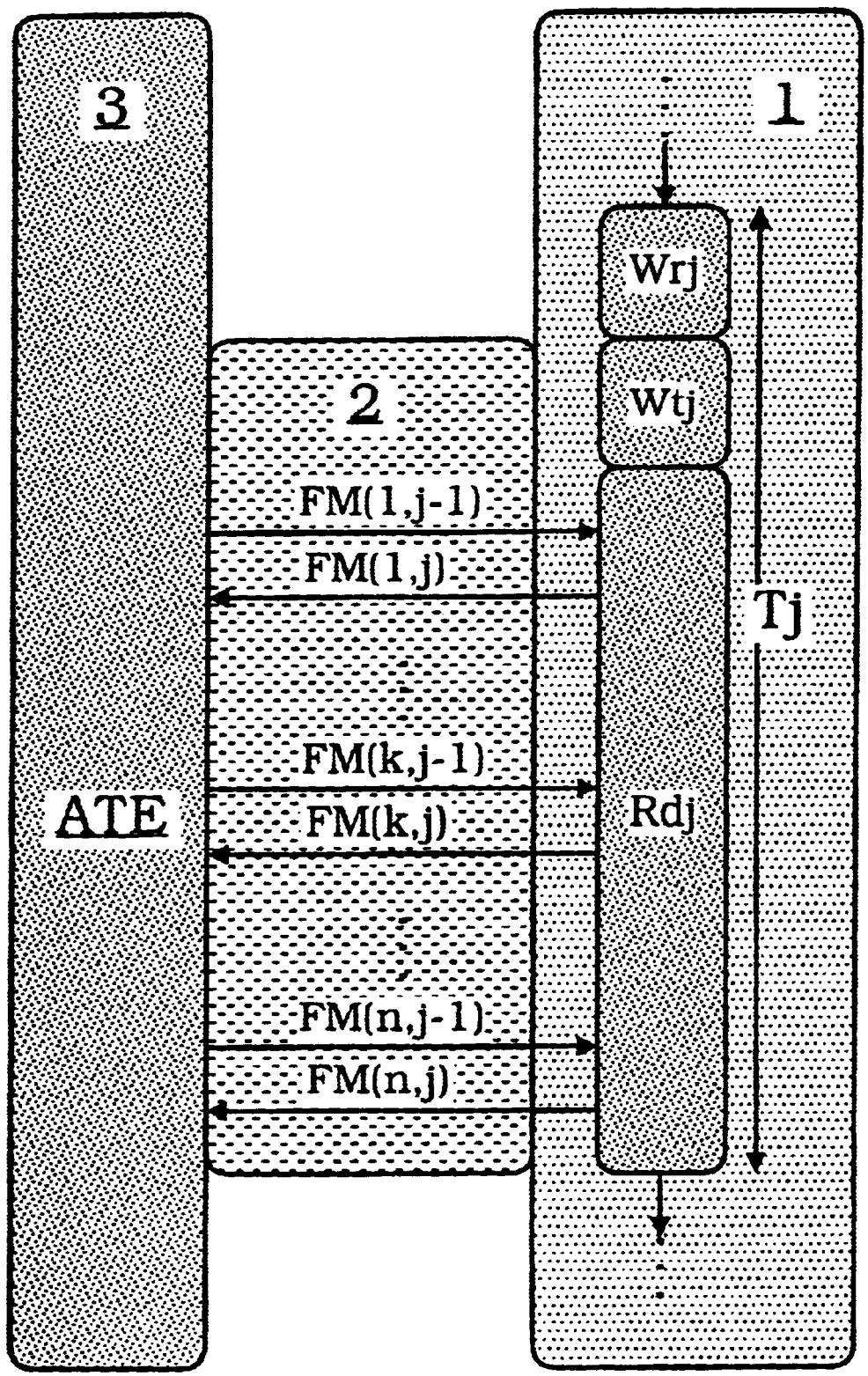
FIG. 3 is a block diagram showing the data exchange in an embodiment of the method according to the invention.

The block diagram of FIG. 3 shows the blockwise data exchange in the handshake method between the semiconductor memory device 1, on the one hand, and the external test device 3, ATE, on the other hand. The exchange is realized via the corresponding connection or communication channel 2. Here, too, again by way of example, any individual test Tj of the sequence of N individual tests to be completed is presented in an exemplary fashion, which again includes a write block Wrj, a waiting/influencing block Wtj and a subsequent read block Rdj—for example in the manner described in FIG. 2.

Via the communication channel 2 between the semiconductor memory device 1 and the external test device 3, ATE, a blockwise data exchange takes place individually for each block B1, ..., Bk, ..., Bn to be tested. Specifically, for the evaluation of the test Tj carried out in the context of the read block Rdj, for each individual one of the n individual blocks B1, ..., Bk, ..., Bn, firstly the previous defect list or fail map FM(k,j-1) is written to the semiconductor memory device 1 and accumulated with the defect data currently arising for the test Tj currently being carried out. The accumulated result is transmitted back individually to the external test device 3, ATE in the form of a blockwise accumulated defect list or fail map FM(k,j) for each of the n individual blocks B1, ..., Bk, ..., Bn.

Overall, then, there arise temporarily exclusively data within the scope of a defect list for an individual memory block B1, ..., Bk, ..., Bn, but not within the scope of all the blocks of the entire memory area 10, 10r, in contrast to methods from the prior art.

Figure 4A:
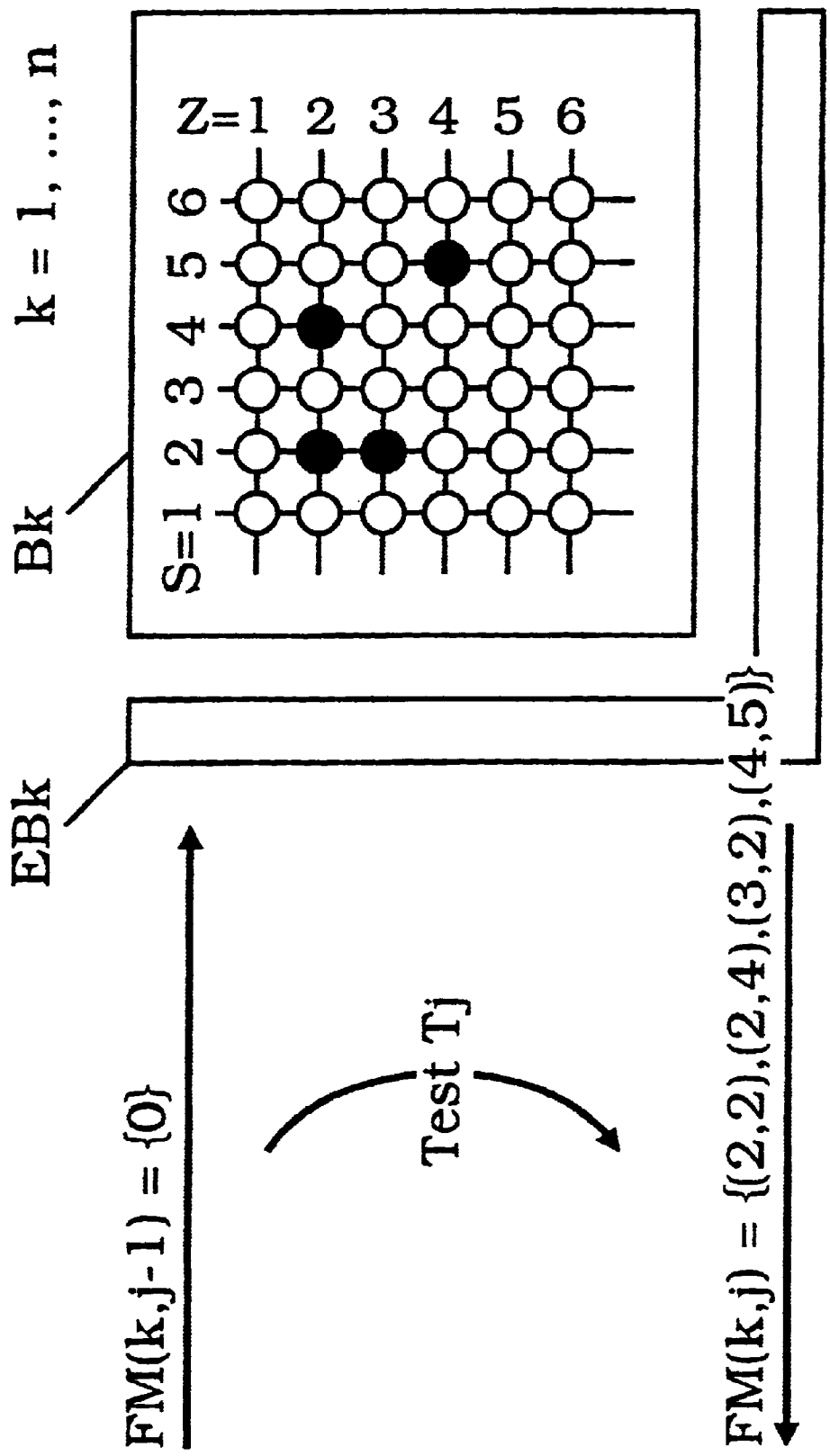
FIGS. 4A, 4B is a schematic view of a memory block of a semiconductor memory device being tested according to the method of the invention.
Figure 4B:
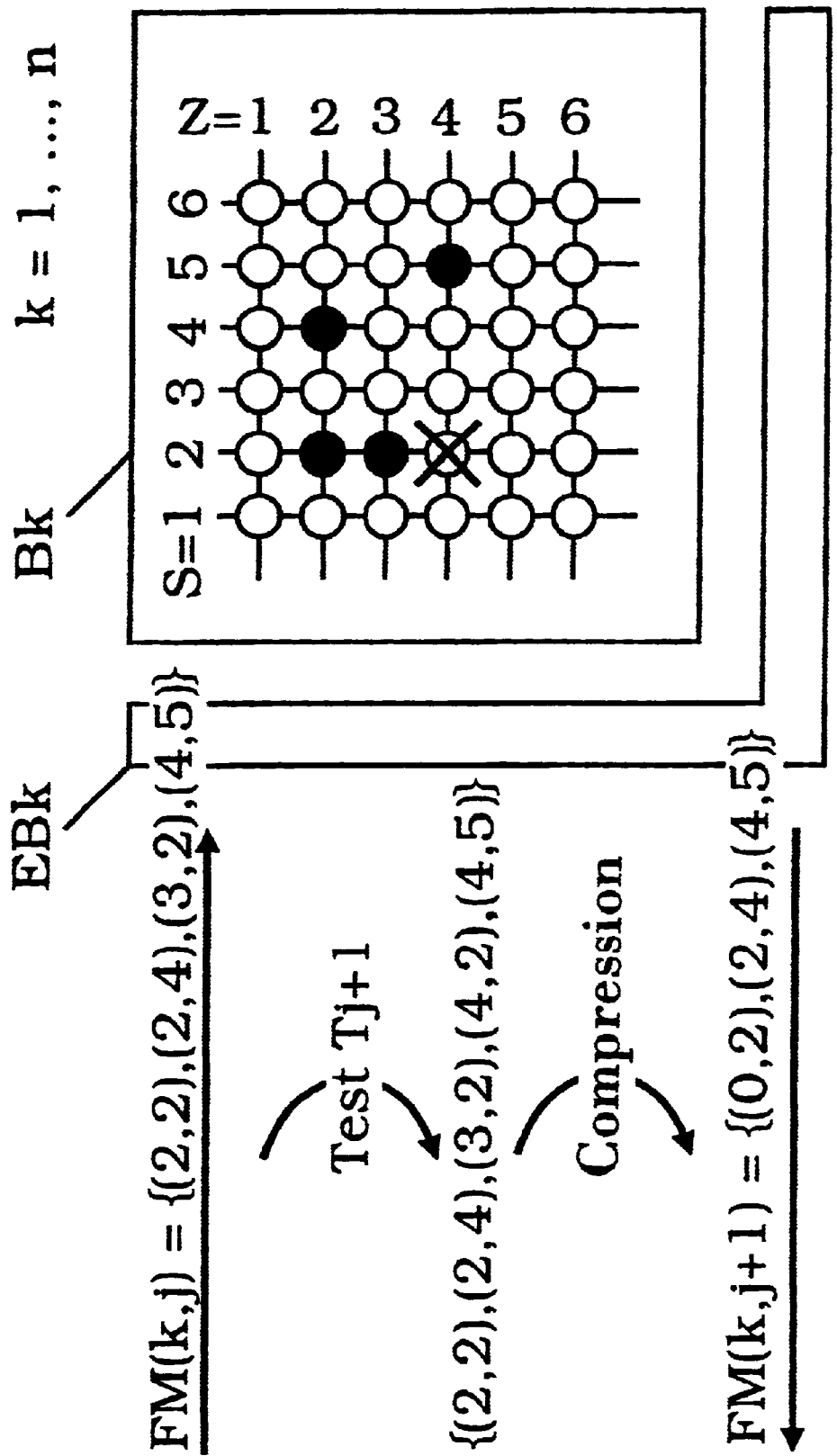

FIGS. 4A and 4B show, in a diagrammatic illustration, the procedure according to the invention for an individual block Bk that is arranged in a matrix-like manner with six columns and six rows and has a replacement memory block Ebk.

In this case, FIG. 4A shows, in diagrammatic form, the carrying out and the result of a jth individual test Tj, while FIG. 4B illustrates the succeeding individual test Tj+1.

During the test Tj, firstly the previous defect list or fail map FM(k,j-1) for the block Bk with regard to the previous test Tj-1 is read into the semiconductor memory device 1. This has the content 0, that is to say no defect has occurred beforehand in previous tests in the case of the current memory block Bk.

During the test Tj, the following cells are then identified as defective during the evaluation, the respective first digit Z of the co-ordinate pairs (Z,S) serving as row address Z and the respective second digit of the co-ordinate pairs (Z,S) serving as column address S:

(2,2), (2,4), (3,2), (4,5).

Consequently, after the jth test Tj, the corresponding defect list or fail map FM(k,j) has the following structure:

$FM(k,j)=\{(2,2), (2,4), (3,2), (4,5)\}$.

In FIG. 4A, the individual memory cells of the rows 1 to 6 and the columns 1 to 6 are marked as corresponding crossover points, the defective memory cells—in accordance with the above specifications—being identified by corresponding filled circles.

When carrying out the subsequent test Tj+1 in accordance with the illustration of FIG. 4B, the cell (4,2) is additionally detected as defective, so that the corresponding subsequent accumulated defect list or fail map FM(k,j+1) would actually have to have the following structure:

$FM(k,j+1)=\{(2,2), (2,4), (3,2), (4,2), (4,5)\}$.

Instead of this, however, in this case for further data compression, assuming that a must repair is present in the case of three or more defects in a column s or in a row z, a corresponding complete replacement of the column 2 is noted as must repair, so that the entire column 2 is noted in the form (0,2), and, as a countermove thereto, all the individual defects (2,2), (3,2) and (4,2) are deleted from the current accumulated defect list or fail map FM(k,j+1), so that the latter acquires the following structure $FM(k,j+1)=\{(0,2), (2,4), (4,5)\}$.

We claim:

1. A method for testing an integrated semiconductor memory device, which comprises the following steps:
   carrying out a test on a memory area of the semiconductor memory device;
   generating test result data of the memory area during the test formed as a plurality of blockwise test result lists; and
   at least temporarily, buffer-storing the test result data formed as the plurality of blockwise test result lists after the test has been carried out, externally of the semiconductor memory device.

2. The method according to claim 1, which further comprises transmitting the test result lists formed as the plurality of blockwise test results to an external storage disposed outside the semiconductor memory device.

3. The method according to claim 1, which further comprises carrying out a plurality of tests.

4. The method according to claim 3, wherein the plurality of tests are carried out successively.

5. The method according to claim 3, wherein each of the plurality of tests is carried out in a blockwise manner in the memory area.

6. The method according to claim 3, which further comprises waiting to form and store the blockwise test result lists until a specific number of the plurality of tests has been carried out.

7. The method according to claim 3, which further comprises waiting to form and store the blockwise test result lists until all of the plurality of tests have been carried out.

8. The method according to claim 1, which further comprises:
   basing the test on a block structure; and
   assigning the test result data to the test result lists based on the block structure.

9. The method according to claim 8, which further comprises:
   providing the memory area with a plurality of memory blocks in a blockwise configuration; and
   basing the block structure on the blockwise configuration of the memory area.

10. The method according to claim 9, which further comprises configuring the memory blocks of the memory area in matrix form.

11. The method according to claim 1, which further comprises accumulating the blockwise test result lists into accumulated blockwise defect lists.

12. The method according to claim 11, which further comprises forming the accumulated blockwise defect lists as fail maps.

13. The method according to claim 11, which further comprises forming and buffer-storing the accumulated blockwise defect lists after each test is carried out.

14. The method according to claim 13, which further comprises accumulating throughout all of the tests all of the accumulated blockwise defect lists for all the individual tests carried out for each of the blocks.

15. The method according to claim 11, which further comprises compressing the accumulated defect lists before the storing of the accumulated defect lists.

16. The method according to claim 15, wherein the compressing step includes:
   taking up, into a respective accumulated defect lists, addresses from at least one test of defective memory cells of a respective memory block.

17. The method according to claim 16, which further comprises:
   configuring the memory blocks in a matrix of columns and rows, with respective column addresses and row addresses; and
   identifying cell addresses with the column addresses and row addresses.

18. The method according to claim 17, which further comprises:
   setting a maximum number of defects in one of the columns an one of the rows;
   taking up a column or a row with the respective column address or row address, as a must repair into the accumulated defect list when the maximum number of defects is exceeded in a column or a row of a respective memory block.

19. The method according to claim 18, which further comprises:
   specifying a must repair by exclusive specification of the column address or row address of the defective column or row, respectively; and
   removing cell addresses of possible individual defects in the respective column or row being removed from the accumulated defect list.

20. The method according to claim 11, which further comprises generating repair schemes based on the accumulated defect lists.

21. The method according to claim 20, which further comprises:
   configuring memory blocks of the memory area as a matrix having columns and rows with column addresses and row addresses for identifying the memory blocks; and
   replacing at least one of defective individual cells, defective columns, and rows by provided repair memory blocks.

22. The method as claimed in claim 20, wherein the repair schemes are executed incrementally after the test is carried out.

23. The method according to claim 22, which further comprises:
after each increment of the repair scheme, repeating previous tests on the memory area in a blockwise manner.

24. The method according to claim 23, which further comprises, after each increment of the repair scheme, carrying out subsequent tests on the memory area.

25. The method according to claim 20, which further comprises forming the repair scheme in the memory area of the semiconductor memory device.

26. The method according to claim 20, which further comprises forming the repair scheme on an external redundancy processor.

27. The method according to claim 20, which further comprises forming the repair scheme on an external test device.

28. The method according to claim 20, which further comprises initially executing the repair scheme provisionally during a pre-fusing phase of fabrication of the semiconductor memory device.

29. The method according to claim 11, which further comprises:
accounting for repair memory blocks of the memory area of the semiconductor memory device during at least one of dividing the memory blocks, assigning the memory blocks, dividing the test result lists, and assigning the accumulated defect lists.

30. The method according to claim 11, which further comprises:
accounting for replacement memory blocks of the memory area of the semiconductor memory device during at least one of dividing the memory blocks, assigning the memory blocks, dividing the test result lists, and assigning the accumulated defect lists.

31. The method according to claim 1, which further comprises accumulating externally the blockwise test result lists outside the memory area of the semiconductor memory device.

32. The method according to claim 31, which further comprises:
providing an external test device; and
storing the blockwise test results in an external test device.

33. The method according to claim 1, which further comprises:
accumulating the blockwise test result lists in the memory area of the semiconductor memory device by, for each block of the memory area, individually:
reading a respective one of the blockwise accumulated defect lists from a previous group including the test for the respective block;
accumulating the test result data of the group including the test currently being carried out for the respective block to form a current blockwise accumulated defect list for the respective block; and
storing the respective current blockwise accumulated defect list for the respective block outside the semiconductor memory device.

34. The method according to claim 33, wherein the blockwise accumulated defect lists from a previous group are read from an external test device.

35. The method according to claim 33, wherein the storing step includes transmitting the current blockwise accumulated defect list to an external test device.

36. The method according to claim 1, which further comprises compressing the test result lists before the storing of the test results lists.

37. The method according to claim 36, wherein the compressing step includes:
taking up, into a respective test, result list cell addresses from at least one test of defective memory cells of a respective memory block.

38. The method according to claim 37, which further comprises:
configuring the memory blocks in a matrix of columns and rows, with respective column addresses and row addresses; and
identifying cell addresses with the column addresses and row addresses.

39. The method according to claim 38, which further comprises:
setting a maximum number of defects in one of the columns an one of the rows;
taking up a column or a row with the respective column address or row address, as a must repair into the test result list when the maximum number of defects is exceeded in a column or a row of a respective memory block.

40. The method according to claim 39, which further comprises:
specifying a must repair by exclusive specification of the column address or row address of the defective column or row, respectively; and
removing cell addresses of possible individual defects in the respective column or row being removed from the test result list.

41. The method according to claim 1, which further comprises:
accounting for repair memory blocks of the memory area of the semiconductor memory device during at least one of dividing the memory blocks, assigning the memory blocks, dividing the test result lists, and assigning the test result lists.

42. The method according to claim 1, which further comprises:
accounting for replacement memory blocks of the memory area of the semiconductor memory device during at least one of dividing the memory blocks, assigning the memory blocks, dividing the test result lists, and assigning the test result lists.

43. The method according to claim 1, which further comprises carrying out the tests in the memory area of the semiconductor memory device.

44. The method according to claim 1, which further comprises carrying out the tests with an external test device.

45. The method according to claim 1, which further comprises generating repair schemes based on the test result lists.

46. The method according to claim 45, which further comprises:
configuring memory blocks of the memory area as a matrix having columns and rows with column addresses and row addresses for identifying the memory blocks; and
replacing at least one of defective individual cells, defective columns, and rows by provided repair memory blocks.

47. The method as claimed in claim 45, wherein the repair schemes are executed incrementally after the test is carried out.

48. The method according to claim 47, which further comprises:
   after each increment of the repair scheme, repeating previous tests on the memory area in a blockwise manner.

49. The method according to claim 48, which further comprises after each increment of the repair scheme, carrying out subsequent tests on the memory area.

50. The method according to claim 45, which further comprises initially executing the repair scheme provisionally during a pre-fusing phase of fabrication of the semiconductor memory device.

51. The method according to claim 45, which further comprises forming the repair scheme in the memory area of the semiconductor memory device.

52. The method according to claim 45, which further comprises forming the repair scheme on an external redundancy processor.

53. The method according to claim 45, which further comprises forming the repair scheme on an external test device.

* * * * *